United States Patent
Yun

(10) Patent No.: US 7,684,275 B2
(45) Date of Patent: Mar. 23, 2010

(54) SEMICONDUCTOR MEMORY DEVICES HAVING MEMORY CELL ARRAYS WITH SHORTENED BITLINES

(75) Inventor: Jong-Sin Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 12/022,344

(22) Filed: Jan. 30, 2008

(65) Prior Publication Data
US 2008/0186782 A1   Aug. 7, 2008

(30) Foreign Application Priority Data
Feb. 6, 2007   (KR) .................. 10-2007-0012204

(51) Int. Cl.
   *G11C 7/00*   (2006.01)
(52) U.S. Cl. .................. 365/208; 365/189.05
(58) Field of Classification Search ............... 365/208, 365/189.05
   See application file for complete search history.

(56) References Cited

U.S. PATENT DOCUMENTS

| | | | |
|---|---|---|---|
| 5,604,705 A | | 2/1997 | Ackland et al. |
| 5,703,815 A | | 12/1997 | Kuhara et al. |
| 6,122,217 A | * | 9/2000 | Keeth et al. ............ 365/230.03 |
| 6,167,541 A | * | 12/2000 | Siek et al. .................. 714/719 |
| 6,226,216 B1 | | 5/2001 | Yu |
| 6,307,795 B1 | * | 10/2001 | Blodgett ..................... 365/200 |
| 6,377,504 B1 | * | 4/2002 | Hilbert .................. 365/230.03 |
| 6,510,533 B1 | * | 1/2003 | Siek et al. .................. 714/719 |
| 6,512,525 B1 | * | 1/2003 | Capps et al. ................ 715/762 |
| 2002/0018391 A1 | * | 2/2002 | Ferrant .................. 365/230.03 |

FOREIGN PATENT DOCUMENTS

| KR | 1020040038067 A | 5/2004 |
|---|---|---|
| KR | 10-2005-0072838 | 7/2005 |

* cited by examiner

*Primary Examiner*—Michael T Tran
(74) *Attorney, Agent, or Firm*—Myers Bigel Sibley & Sajovec

(57) ABSTRACT

A semiconductor memory device includes a first memory cell array that comprises first memory cells arranged in a matrix of first rows and first columns; a second memory cell array that comprises second memory cells arranged in a matrix of second rows and second columns; a row decoder that is configured to select and activate one of the rows of the first and second cell arrays in response to a row address; a sense amplifier that may be disposed between the first memory cell array and the second memory cell array; a switch that is configured to selectively connect the sense amplifier to the first memory cell array and the second memory cell array; and a switch controller that is configured to control the switch to connect the sense amplifier to one of the first and second memory cell arrays based on the row address.

13 Claims, 7 Drawing Sheets

SEMICONDUCTOR MEMORY DEVICES HAVING MEMORY CELL ARRAYS WITH SHORTENED BITLINES

CROSS-REFERENCE TO RELATED APPLICATION

This U.S. non-provisional patent application claims priority under 35 U.S.C. § 119 from Korean Patent Application No. 2007-12204, filed on Feb. 6, 2007, the disclosure of which is hereby incorporated herein by reference as if set forth in its entirety.

FIELD OF THE INVENTION

The present invention relates to semiconductor memory devices and, more particularly, to the memory cell array structure of semiconductor memory devices.

BACKGROUND

FIG. 1 is a block diagram of a conventional semiconductor memory device 100. The semiconductor memory device 100 includes a memory cell array 110, a row decoder 120, a precharge circuit 130, a sense amplifier 140, and a controller 150.

The memory cell array 110 includes a plurality of memory cells that are arranged in a matrix of rows and columns. A plurality of wordlines (W/L) define the rows of the matrix, and a plurality of bitlines define the columns of the matrix. A memory cell is located at or adjacent to the intersection of each wordline and bitline. The structure of each memory cell will depend upon the type of semiconductor memory device. For example, each memory cell of a Dynamic Random Access Memory (DRAM) device may include one transistor and one capacitor. In a DRAM memory cell, the gate of the transistor is connected to a wordline of the memory cell array 110, the source of the transistor is connected to a bitline of the memory cell array 110, and the drain of the transistor is connected to the cell capacitor. The amount of charge stored in the capacitor represents one or more bits of data.

The semiconductor memory device 100 of FIG. 1 may operate as follows. When a read command CMD is received, the controller 150 applies a control signal BLPC to the precharge circuit 130. The precharge circuit 130 precharges a bitline in response to the control signal BLPC. After the bitline is precharged, the row decoder 120 activates a wordline of the memory cell array 110 in response to a row address ADDR that is input from a row address buffer (not shown). During a read operation, the data stored in the memory cell is determined based on the difference between the voltage of the bitline that is attached to the memory cell that is being read (i.e., the memory cell at the intersection of the bitline and the activated wordline) and the voltage of a reference bitline. The controller 150 applies a control signal SAE to the sense amplifier 140 that causes the sense amplifier 140 to sense and amplify this voltage difference. Since the capacitance of a bitline is higher than the capacitance of the memory cell, the bitline voltage only fluctuates slightly during a read operation. The bitline voltage sensed and amplified by the sense amplifier 140 is output through an output terminal (not shown). As a result, data stored in any memory cell of the memory cell array 110 may be read out.

As the integration density of a semiconductor memory device increases, the number of memory cells that are connected to each bitline likewise increases. Since memory cells have their own capacitances, the capacitance of a bitline increases as the number of memory cells connected to the bitline increases (the capacitance increases when capacitors are connected in parallel). Due to the increased capacitance, the fluctuation of the bitline voltage during a read operation is reduced. This may make it more difficult to accurately sense data. In addition, the power and time that are required to precharge the bitline increases, and thus system performance may be degraded.

SUMMARY

Pursuant to embodiments of the present invention, semiconductor memory devices are provided that include a first memory cell array that has a plurality of first memory cells arranged in a matrix of first rows and first columns and a second memory cell array that has a plurality of second memory cells arranged in a matrix of second rows and second columns. The device further includes a row decoder that is configured to select and activate one of the first rows or the second rows in response to a row address. The device also includes a sense amplifier and a switch that is configured to selectively connect the sense amplifier to one of the first memory cell array or the second cell array. In some embodiments, the sense amplifier may be disposed between the first memory cell array and the second memory cell array. The device may also include a switch controller that is configured to connect the sense amplifier to the first memory cell array if the row address corresponds to one of the first rows and to connect the sense amplifier to the second memory cell array if the row address corresponds to one of the second rows.

Pursuant to further embodiments of the present invention, semiconductor memory devices are provided that include a first memory cell array that comprises a plurality of first wordlines, a plurality of first bitlines, and a plurality of first memory cells that are arranged at the respective intersections of the first wordlines and the first bitlines and a second memory cell array that comprises a plurality of second wordlines, a plurality of second bitlines, and a plurality of second memory cells that are arranged at the respective intersections of the second wordlines and the second bitlines. The device also includes a row decoder that is configured to select one of the first and second memory cell arrays in response to a row address. The device also includes a sense amplifier that is arranged between the first memory cell array and the second memory cell array, as well as a switch that is configured to connect the sense amplifier to the first memory cell array in response to a first switch enable signal and to connect the sense amplifier to the second memory cell array in response to a second switch enable signal. Finally, a controller is provided that is configured to activate one of the first and second switch enable signals in response to the row address.

DETAILED DESCRIPTION

Figure 1:
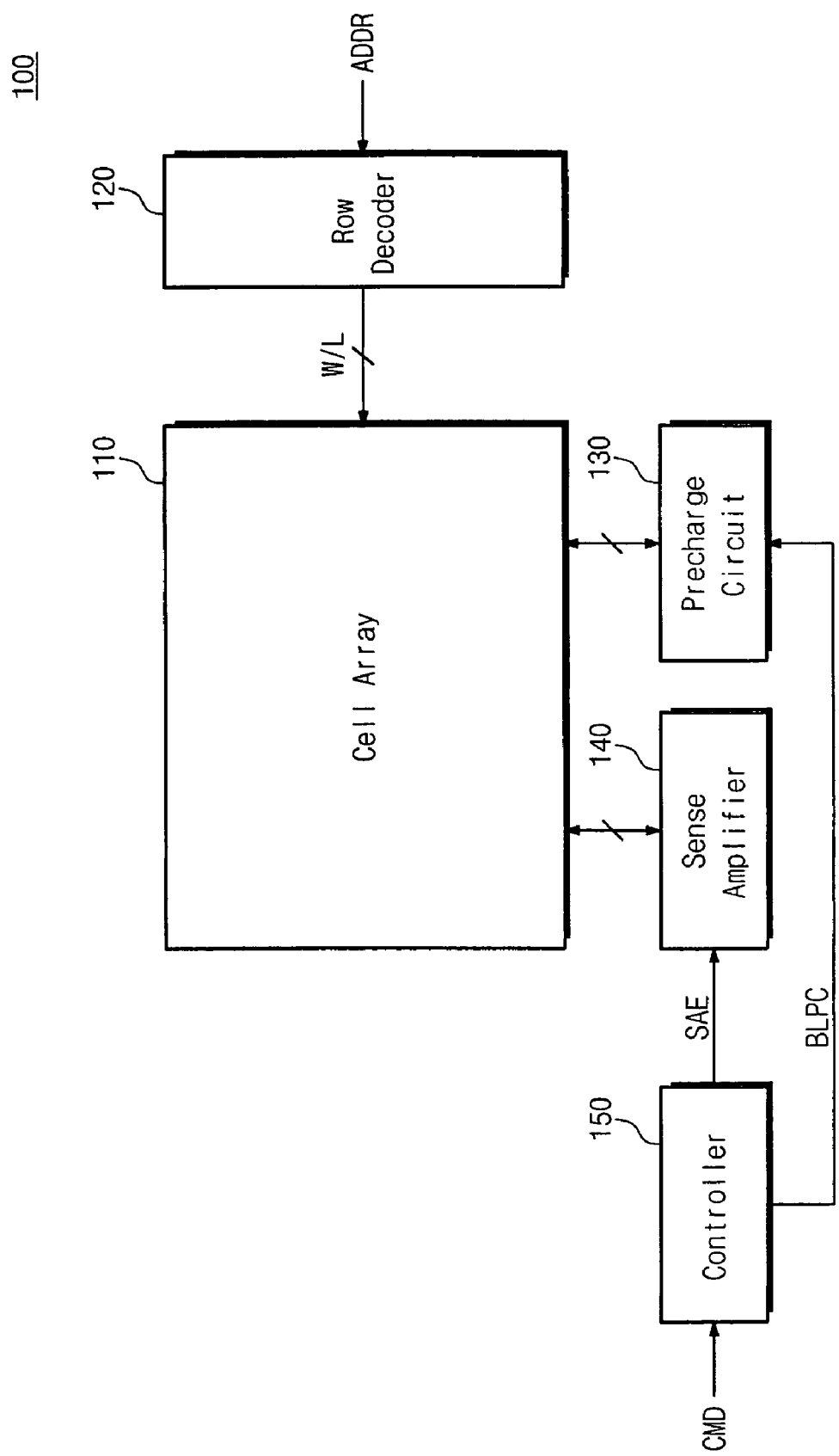
FIG. 1 is a block diagram of a conventional semiconductor memory device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 2:
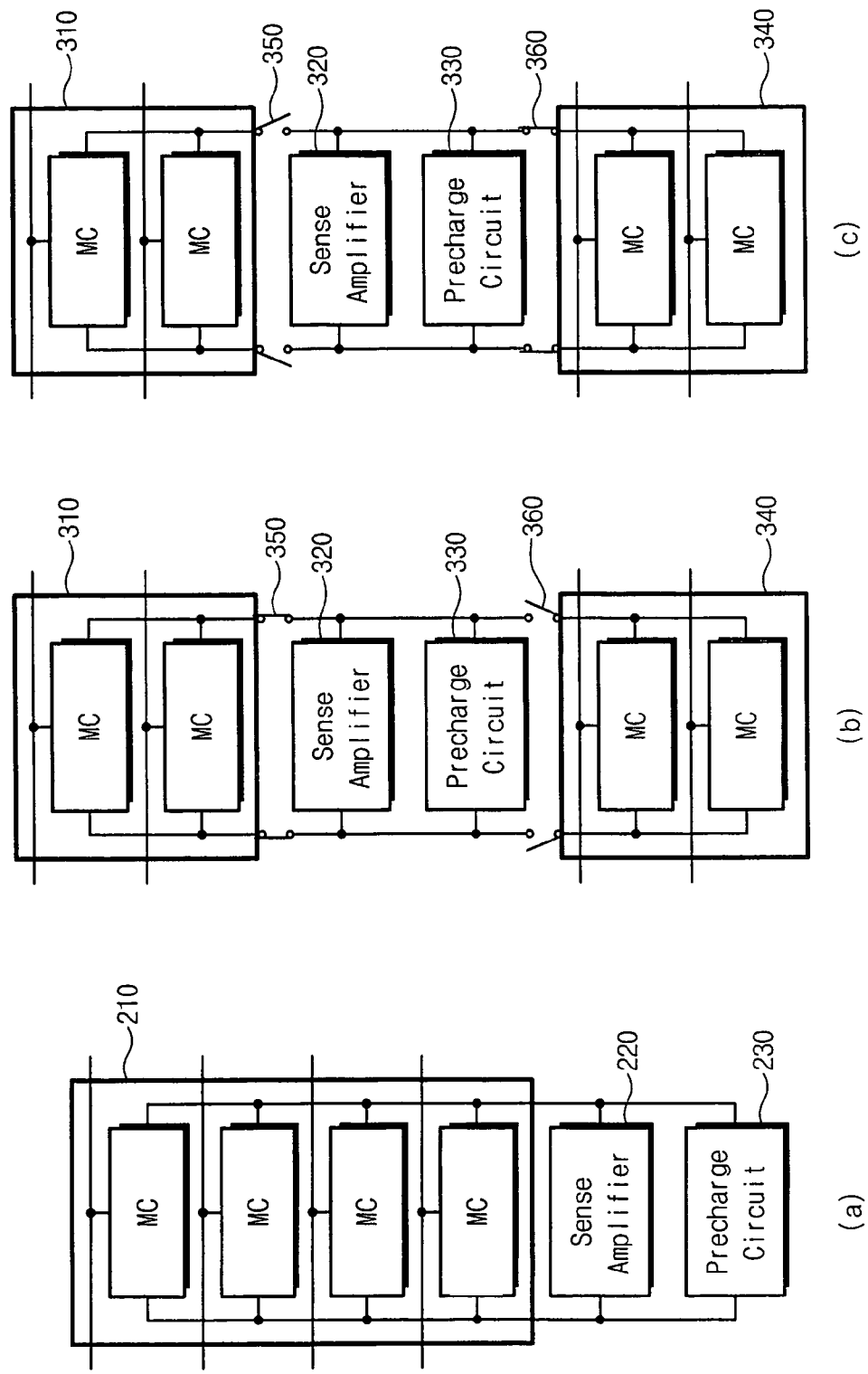
FIG. 2 is a series of block diagrams that comparatively illustrate a conventional semiconductor memory device and a semiconductor memory device according to embodiments of the present invention.

A conventional semiconductor memory device and a semiconductor memory device according to embodiments of the present invention are comparatively illustrated in FIG. 2. In particular, FIG. 2(a) is a block diagram of a conventional memory device. As shown in FIG. 2(a), a sense amplifier 220 and a precharge circuit 230 are disposed at one side of a memory cell array 210. The sense amplifier 220 senses and amplifies bitline voltages of the memory cell array 210, and the precharge circuit 230 precharges the bitlines.

FIGS. 2(b) and 2(c) are block diagrams of a memory device according to embodiments of the present invention. As shown in FIGS. 2(b) and 2(c), the memory cell array is divided into a top memory cell array 310 and a bottom memory cell array 340. A sense amplifier 320 and a precharge circuit 330 of the memory device are disposed in between the top and bottom memory cell arrays 310, 340, and may be selectively connected to the top memory cell array 310 or the bottom memory cell array 340 through a top switch 350 or a bottom switch 360.

In FIG. 2(b), the sense amplifier 320 and the precharge circuit 330 are connected to the top memory cell array 310. The top switch 350 is closed, while the bottom switch 360 is left open. The sense amplifier 320 senses and amplifies bitline voltages of the top memory cell array 310, and the precharge circuit 330 precharges the bitlines of the top memory cell array 310.

In FIG. 2(c), the sense amplifier 320 and the precharge circuit 330 are connected to the bottom memory cell array 340. The top switch 350 is left open, while the bottom switch 360 is closed. The sense amplifier 320 senses and amplifies bitline voltages of the bottom memory cell array 340, and the precharge circuit 330 precharges the bitlines of the bottom memory cell array 340.

As is also illustrated in FIGS. 2(b) and 2(c), the bitlines that are connected to the sense amplifier 320 and the precharge circuit 330 may only have half as many memory cells MC connected thereto as do the bitlines of the conventional memory device. Since the capacitance of a bitline decreases as the number of memory cells MC connected to the bitline decreases, the sense amplifier 320 may sense the fluctuation of the bitline voltage more quickly and accurately. Moreover, it is possible to reduce the power consumed when the precharge circuit 330 precharges the bitline.

Figure 3:
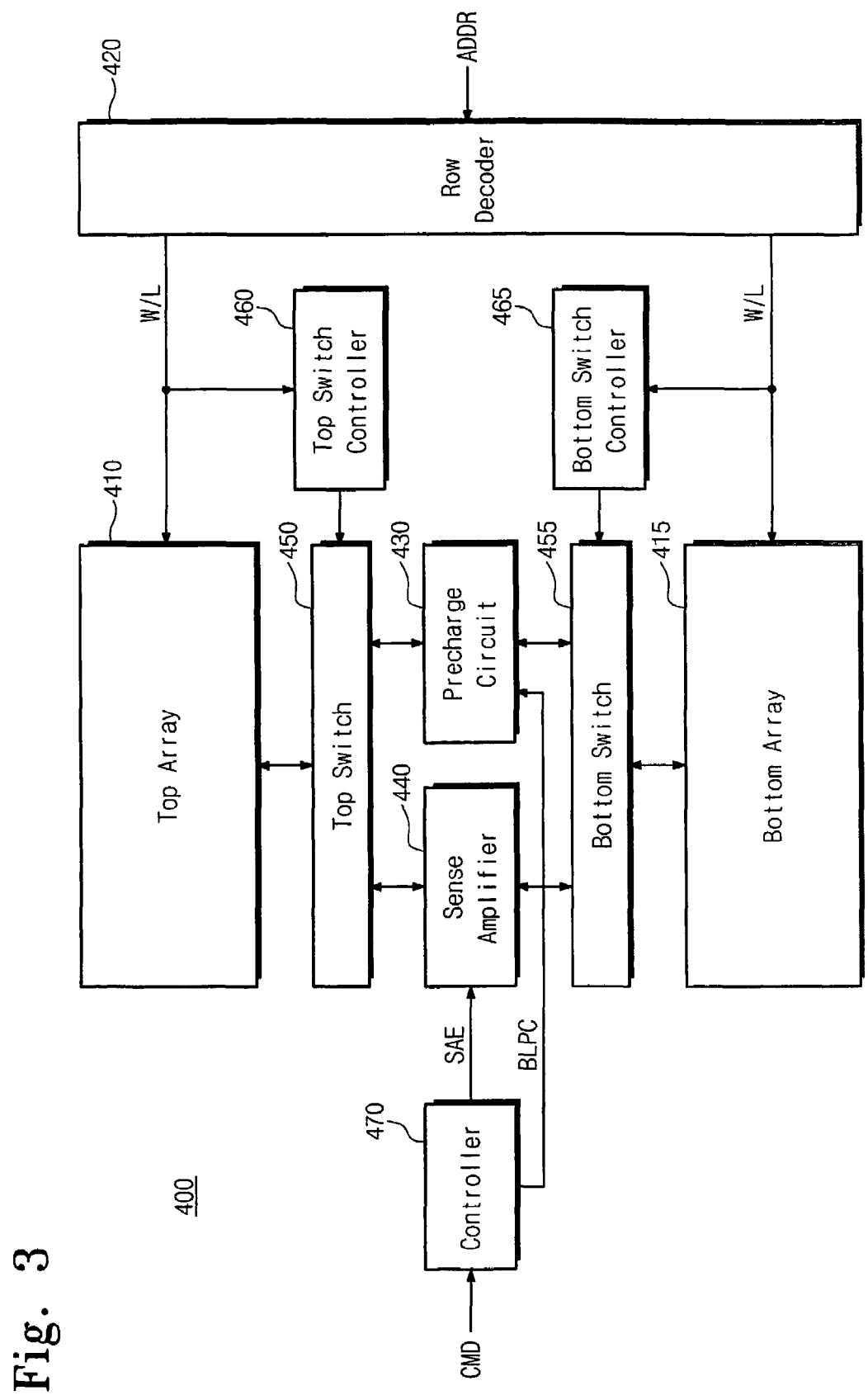
FIG. 3 is a block diagram of a semiconductor memory device according to embodiments of the present invention.

FIG. 3 is a block diagram of a semiconductor memory device 400 according to certain embodiments of the present invention. The semiconductor memory device 400 includes top and bottom memory cell arrays 410 and 415, a row decoder 420, a precharge circuit 430, a sense amplifier 440, top and bottom switches 450 and 455, top and bottom switch controllers 460 and 465, and a controller 470. Since the memory cell array is divided into top and bottom memory cell arrays 410 and 415, the bitlines of both the top cell array 410 and the bottom cell array 415 may each have a length that is only one half the length of an equivalent device that included a single memory cell array, and may only have half as many memory cells connected thereto.

Each of the memory cell arrays 410 and 415 includes a plurality of memory cells that are arranged in a matrix of rows and columns. Each individual memory cell may be an SRAM cell, a DRAM cell or the like. Each of the memory cells is connected to a wordline (which define the rows of the memory cell array) and a bitline (which define the columns of the memory cell array). The row decoder 420 is connected to wordlines of the top and bottom memory cell arrays 410 and 415 and activates a wordline in response to a row address ADDR input from a row address buffer (not shown). The precharge circuit 430 is connected to a bitline pair of the top memory cell array 410 or the bottom memory cell array 415 to precharge a bitline. Based on the precharged bitline voltage, a determination may be made as to whether a particular bitline voltage has fluctuated based on the charge stored in a memory cell connected to that bitline.

The sense amplifier 440 is connected to a bitline pair of the top memory cell array 410 or the bottom memory cell array 415 to sense and amplify a bitline voltage. The top and bottom switches 450 and 455 connect the sense amplifier 440 and the precharge circuit 430 to the top memory cell array 410 or the bottom memory cell array 415, respectively. Thus, the sense amplifier 440 and the precharge circuit 430 are selectively connected to the top memory cell array 410 or to the bottom memory cell array 415, which means the length of the bitline connected to the sense amplifier 440 and the precharge circuit 430 may be reduced by half.

The top and bottom switch controllers 460, 465 are connected to a plurality of wordlines of the top and bottom memory cell arrays 410, 415 to control the top and bottom switches 450 and 455. The top and bottom switch controllers 460, 465 may, in some embodiments, be implemented as a single switch controller. The controller 470 controls the operations of the sense amplifier 440 and the precharge circuit 430 in response to an external command CMD.

In summary, either the top memory cell array 410 or the bottom memory cell array 415 is selected based on the wordline that is activated by the row decoder 420, and the sense amplifier 440 and the precharge circuit 430 are selectively connected to the selected one of the memory cell arrays 410, 415. By dividing the memory cell array into separate top and bottom memory cell arrays 410, 415, the number of memory cells connected to any given bitline may be reduced by half. As a result, the semiconductor memory device 400 may operate at a high speed while consuming low power.

Figure 4:
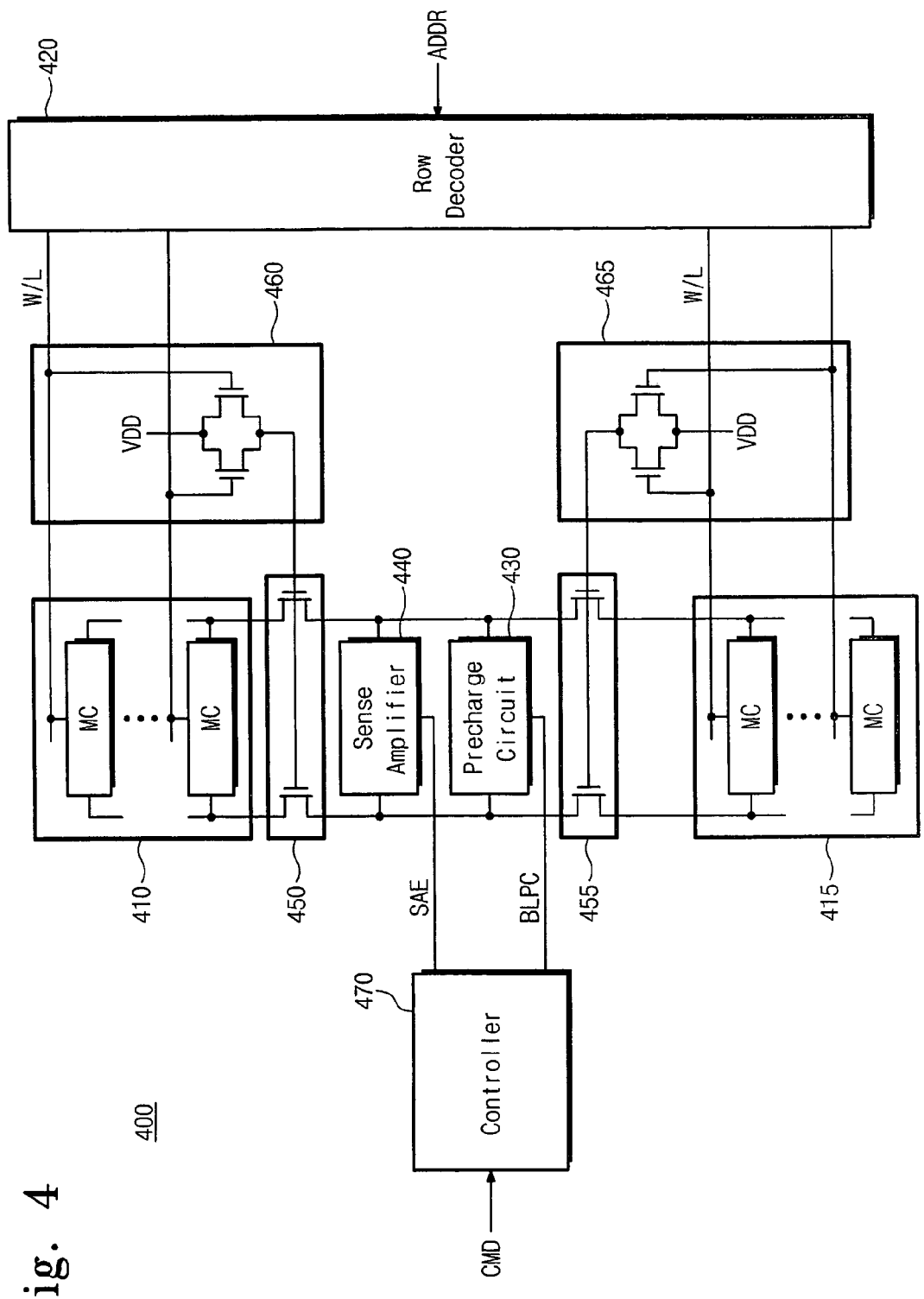
FIG. 4 is a detailed circuit diagram of the semiconductor memory device of FIG. 3.

FIG. 4 is a detailed circuit diagram of the semiconductor memory device 400 illustrated in FIG. 3. A read operation of the semiconductor memory device 400 may be initiated when a read command CMD and a row address ADDR are input to the semiconductor memory device 400.

The top and bottom switch controllers 460, 465 control the top and bottom switches 450, 455, respectively. As shown in FIG. 4, the top and bottom switch controllers 460 and 465 are connected to a plurality of wordlines, and may include one transistor per wordline. The gates of the transistors of the top switch controller 460 may be connected to respective ones of the wordlines of the top memory cell array 414, while the gates of the transistors of the bottom switch controller 465 may be connected to respective ones of the wordlines of the bottom memory cell array 415. When a specific wordline is activated by the row decoder 420, the transistor connected to the activated wordline is turned on, which in turn applies a voltage VDD to the top switch 450 or to the bottom switch 455. Thus activation of a wordline that is connected to the top switch controller 460 selectively turns on the top switch 450, while activation of a wordline that is connected to the bottom switch controller 465 selectively turns on the bottom switch 455.

For example, if the row address ADDR that is applied to the row decoder 420 corresponds to a wordline of a top memory cell array 410, the top switch controller 460 applies the voltage VDD to the top switch 450. Thus, the top switch 450 is turned on, thereby connecting sense amplifier 440 and precharge circuit 430 to the top memory cell array 410. On the other hand, if the row address ADDR that is applied to the row decoder 420 corresponds to a wordline of the bottom memory cell array 415, the bottom switch controller 465 applies the voltage VDD to the bottom switch 455. Thus, the bottom switch 455 is turned on to connect the sense amplifier 440 and the precharge circuit 430 to the bottom memory cell array 415.

The controller 470 may apply a control signal BLPC to the precharge circuit 430 in response to a read command CMD. This may be done, for example, at the same time that the connection of the precharge circuit 430 to the top memory cell array 410 or to the bottom memory cell array 415 is established. The precharge circuit 430 precharges a bitline in response to the control signal BLPC. The operation of the precharge circuit 430 is well known in the art, and thus will not be described in further detail herein.

After the bitline is precharged, the row decoder 420 activates a wordline in response to the row address ADDR. In response to activation of the wordline, the voltage of the bitline fluctuates based on the data stored in the memory cell at the intersection of the bitline and the activated wordline. The controller 470 applies a control signal SAE to the sense amplifier 440. The sense amplifier 440 senses and amplifies the bitline voltage in response to the control signal SAE and outputs the sensed and amplified bitline voltage.

Thus, in summary, the top switch 450 is selected (i.e., closed) by the top switch controller 460 or the bottom switch 455 is selected (i.e., closed) by the bottom switch controller 465 based on the row address ADDR. After a bitline is precharged by the precharge circuit 430, a wordline is activated by the row decoder 420. The bitline is sensed and amplified by the sense amplifier 440. These steps may be performed substantially simultaneously.

Figure 5:
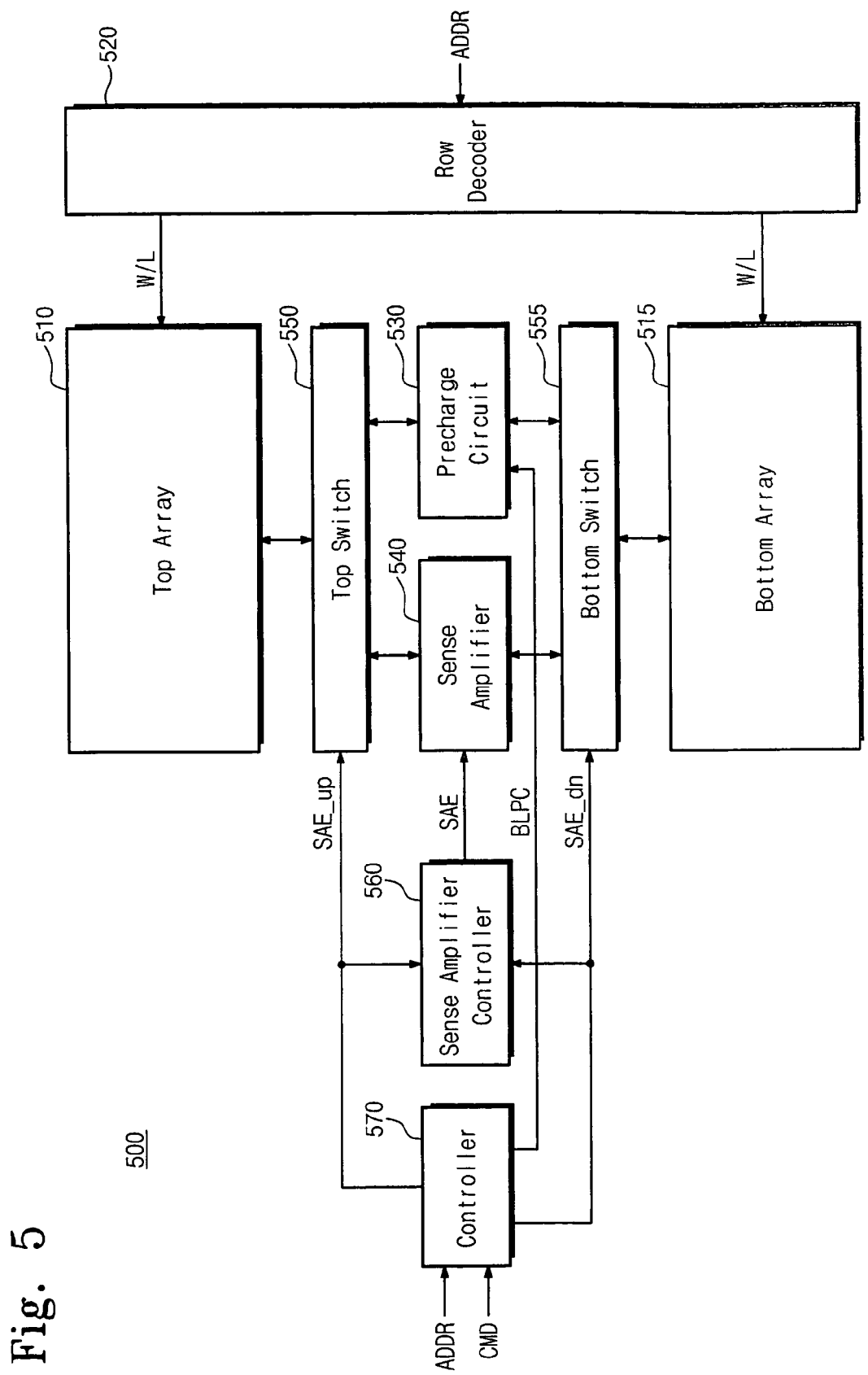
FIG. 5 is a block diagram of a semiconductor memory device according to further embodiments of the present invention.

FIG. 5 is a block diagram of a semiconductor memory device 500 according to further embodiments of the present invention. The semiconductor memory device 500 includes top and bottom memory cell arrays 510 and 515, a row decoder 520, a precharge circuit 530, a sense amplifier 540, top and bottom switches 550 and 555, a sense amplifier controller 560, and a controller 570. Since the memory cell array is divided into top and bottom memory cell arrays 510 and 515, each bitline of the top memory cell array 510 and each bitline of the bottom memory cell array 515 may be reduced in length by approximately half.

Each of the memory cell arrays 510, 515 includes a plurality of memory cells that are arranged in a matrix of rows and columns. The memory cells may be SRAM cells, DRAM cells or other types of memory cells. Each of the memory cells is connected to a wordline (which define the rows of the memory cell array) and to a bitline (which define the columns of the memory cell array). The row decoder 520 is connected to the wordlines of the top and bottom memory cell arrays 510, 515, and activates a wordline in response to a row address ADDR that is input from a row address buffer (not shown). The precharge circuit 530 is connected to a bitline pair of the top memory cell array 510 or to a bitline pair of the bottom memory cell array 515 to precharge the bitline pair. Based on the precharged bitline voltage, a determination may be made as to whether a particular bitline voltage has fluctuated based on the charge stored in a memory cell connected to that bitline.

The sense amplifier 540 is connected to a bitline pair of the top memory cell array 510 or of the bottom memory cell array 515 to sense and amplify a bitline voltage. The top and bottom switches 550 and 555 connect the sense amplifier 540 and the precharge circuit 530 to the top memory cell array 510 or to the bottom memory cell array 515, respectively. Thus, the sense amplifier 540 and the precharge circuit 530 are selectively connected to the top memory cell array 510 or to the bottom memory cell array 515, which means the length of the bitline connected to the sense amplifier 540 and the precharge circuit 530 may be reduced by half.

The controller 570 controls operations of the top and bottom switches 550 and 555, the sense amplifier controller 560, and the precharge circuit 530 in response to an external command CMD and a row address ADDR. For example, if the row address ADDR corresponds to a wordline within the top memory cell array 510, the controller 570 applies a control signal SAE_up to turn on (i.e., close) the top switch 550 and operate the sense amplifier 540. Similarly, if the row address ADDR corresponds to a wordline within the bottom memory cell array 515, the controller 570 applies a control signal SAE_dn to turn on (i.e., close) the bottom switch 555 and operate the sense amplifier 540. In each case, the controller 570 activates a control signal BLPC to operate the precharge circuit 530.

As described above, the sense amplifier 540 and the precharge circuit 530 are selectively connected to the top memory cell array 510 or to the bottom memory cell array 515. Thus, the semiconductor memory device 500 may operate at a high speed while consuming low power.

Figure 6:
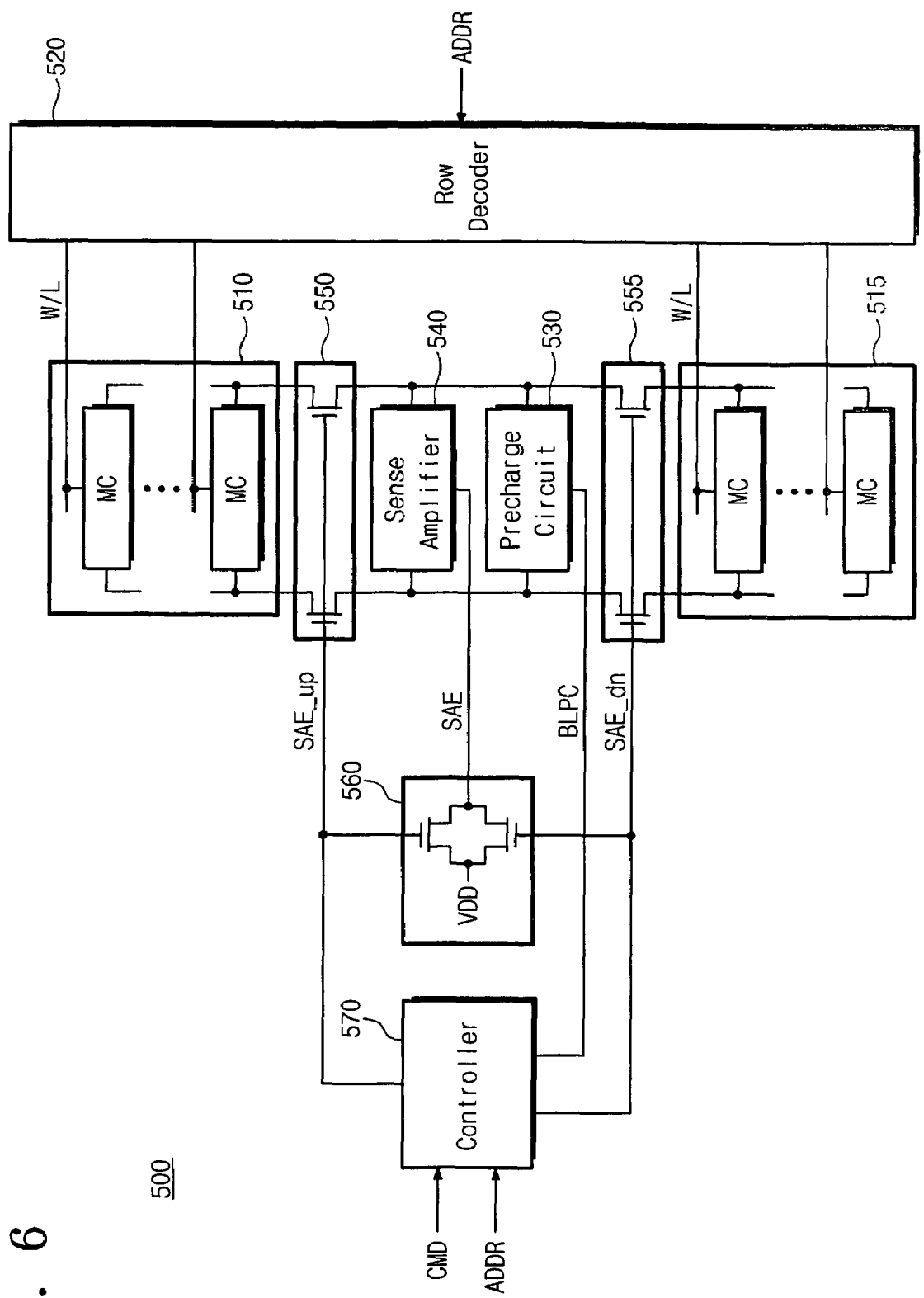
FIG. 6 is a detailed circuit diagram of the semiconductor memory device of FIG. 5.

FIG. 6 is a detailed circuit diagram of the semiconductor memory device 500 illustrated in FIG. 5. A read operation of the semiconductor memory device 500 may be initiated by inputting a read command CMD and a row address ADDR to the semiconductor memory device 500.

The controller 570 activates one of two control signals SAE_up and SAE_dn in response to the row address ADDR. For example, if the row address ADDR corresponds to a wordline within the top memory cell array 510, the controller 570 activates the control signal SAE_up. Activation of the control signal SAE_up turns on the top switch 550, and activation of the control signal SAE_dn turns on the bottom switch 555. Thus, the sense amplifier 540 and the precharge circuit 530 may be selectively connected to the top memory cell array 510 or to the bottom memory cell array 515 based on the input row address ADDR.

In response to the read command CMD, the controller 570 sends a control signal BLPC to the precharge circuit 530 that controls the precharge circuit 530 to precharge a bitline. In some embodiments, this may occur at the same time that the precharge circuit is connected to the top memory cell array 510 or to the bottom memory cell array 515. After the bitline is precharged, the row decoder 520 activates a wordline in response to the row address ADDR. The bitline voltage fluctuates based on the data that is stored in the memory cell that is located at the intersection of the activated wordline and bitline. The sense amplifier controller 560 activates a control signal SAE. In response to this control signal SAE, the sense amplifier 540 senses and amplifies the bitline voltage and outputs the sensed and amplified bitline voltage.

Thus, the top switch 550 or the bottom switch 555 is selected by the controller 570. After a bitline is precharged by the precharge circuit 530, a wordline is activated by the row decoder 520. The bitline is sensed and amplified by the sense amplifier 540. These steps may be conducted at substantially the same time.

Figure 7:
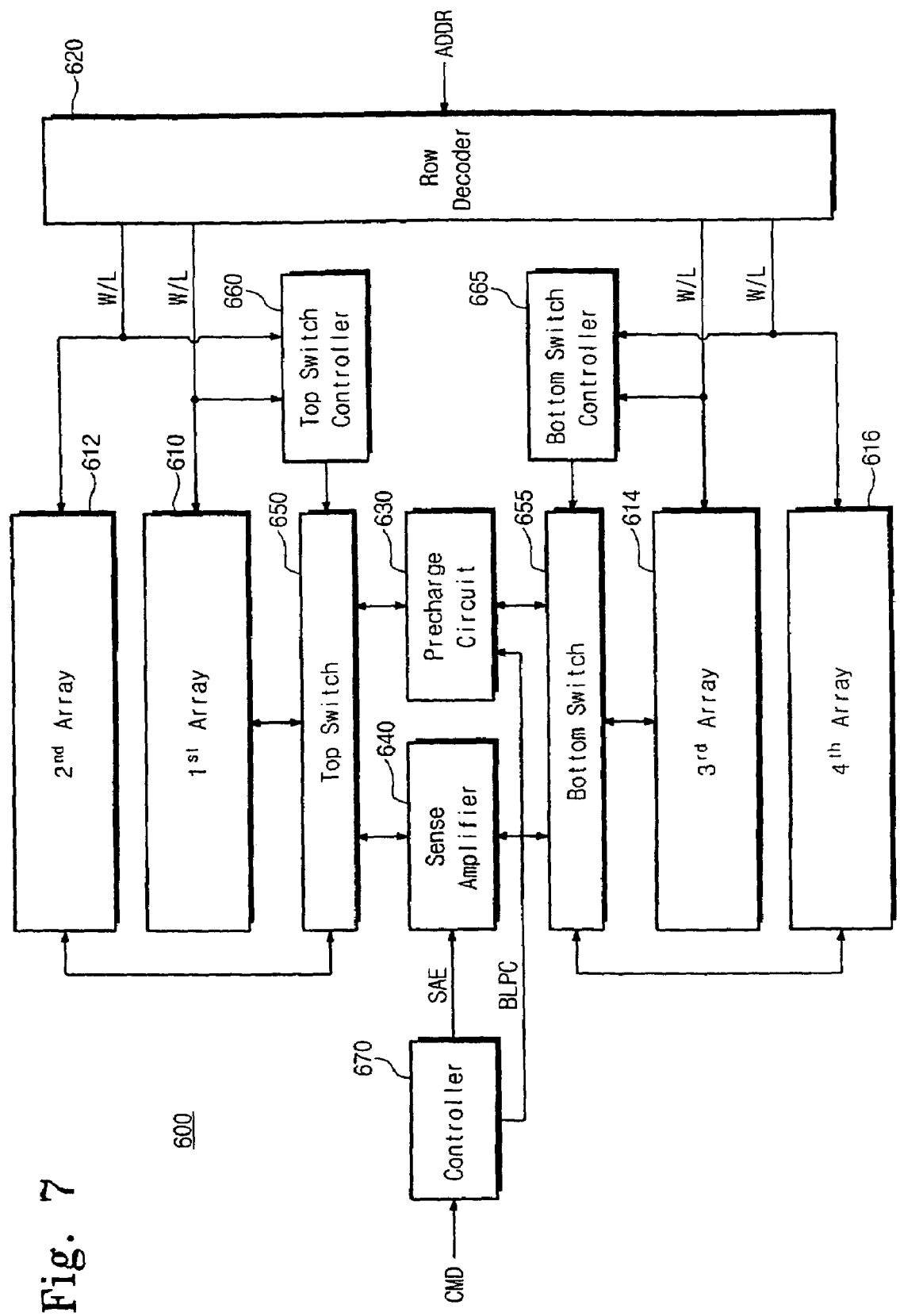
FIG. 7 is a block diagram of a semiconductor memory device according to further embodiments of the present invention.

FIG. 7 is a block diagram of a semiconductor memory device 600 according to still further embodiments of the present invention. The semiconductor memory device 600 includes first through fourth memory cell arrays 610, 612, 614, 616, a row decoder 620, a precharge circuit 630, a sense amplifier 640, top and bottom switches 650 and 655, top and bottom switch controllers 660 and 665, and a controller 670. Since the memory cell array is divided into four memory cell arrays 610, 612, 614, 616, the bitlines of each memory cell array may each have a length that is only one quarter the length of an equivalent device that included a single memory cell array, and may only have one-quarter as many memory cells connected thereto.

Each of the memory cell arrays 610, 612, 614, 616 includes a plurality of memory cells that are arranged in a matrix of rows and columns. Each individual memory cell may be an SRAM cell, a DRAM cell or the like. Each of the memory cells is connected to a wordline (which define the rows of the memory cell array) and a bitline (which define the columns of the memory cell array). The row decoder 620 is connected to wordlines of the memory cell arrays 610, 612, 614, 616 and activates a wordline in response to a row address ADDR input from a row address buffer (not shown). The precharge circuit 630 is connected to a bitline pair of each memory cell array 610, 612, 614, 616 to precharge a bitline. Based on the precharged bitline voltage, a determination may be made as to whether a particular bitline voltage has fluctuated based on the charge stored in a memory cell connected to that bitline.

The sense amplifier 640 is connected to a bitline pair of each memory cell array 610, 612, 614, 616 to sense and amplify a bitline voltage. In the particular embodiment shown, the top switch 650 connects the sense amplifier 640 and the precharge circuit 630 to one of the first or second memory cell arrays 610, 612, and the bottom switch 655 connects the sense amplifier 640 and the precharge circuit 630 to one of the third and fourth memory cell arrays 614, 616. Thus, the sense amplifier 640 and the precharge circuit 630 are selectively connected to one of the first through fourth memory cell arrays 610, 612, 614, 616.

The top switch controller 660 is connected to a plurality of wordlines of the first and second memory cell arrays 610, 612 and controls the top switch 650. The bottom switch controller 665 is connected to a plurality of wordlines of the third and fourth memory cell arrays 614, 616 and controls the bottom switch 655. The top and bottom switch controllers 660, 665 may, in some embodiments, be implemented as a single switch controller. In other embodiments, four separate controllers may be provided. Likewise, the top and bottom switches 650, 655 can be implemented as a single switch or as four switches. The controller 670 controls the operations of the sense amplifier 640 and the precharge circuit 630 in response to an external command CMD.

The capacitance of a bitline can have an effect on power and/or time required when the precharge circuit precharges a bitline. The capacitance of the bitline also can have an effect on a sensing speed when the sense amplifier senses the bitline. According to embodiments of the present invention, the capacitance of the bitlines may be reduced by dividing the memory cell array into two (or more) sub-arrays. Each sub-array includes its own bitlines, and hence the number of memory cells connected to any given bitline may be reduced. This reduction in the number of memory cells per bitline decreases the capacitance of the bitline, which can decrease both the power and time required to precharge a given bitline. The decrease in the capacitance of each bitline may also allow for increased bitline sensing speed.

Although embodiments of the present invention have been described in connection with the accompanying drawings, it is not limited thereto. It will be apparent to those skilled in the art that various substitutions, modifications and changes may be made without departing from the scope and spirit of the invention.

What is claimed is:

1. A semiconductor memory device comprising:
   a first memory cell array that comprises a plurality of first memory cells that are arranged in a matrix of first rows and first columns;
   a second memory cell array that comprises a plurality of second memory cells that are arranged in a matrix of second rows and second columns;
   a row decoder that is configured to select and activate one of the first rows or the second rows in response to a row address;

a sense amplifier; and a switch that is configured to selectively connect the sense amplifier to one of the first memory cell array or the second memory cell array in response to activation of one of the first rows or the second rows by the row decoder.

2. The semiconductor memory device of claim 1, wherein the sense amplifier is disposed between the first memory cell array and the second memory cell array.

3. The semiconductor memory device of claim 2 further comprising a switch controller that is configured to connect the sense amplifier to the first memory cell array if the row address corresponds to one of the first rows and to connect the sense amplifier to the second memory cell array if the row address corresponds to one of the second rows.

4. The semiconductor memory device of claim 3, wherein each of the first and second memory cell arrays includes SRAM cells.

5. The semiconductor memory device of claim 3, wherein the switch comprises:
   a first switch unit that is coupled between the first memory cell array and the sense amplifier; and
   a second switch unit that is coupled between the second memory cell array and the sense amplifier.

6. The semiconductor memory device of claim 5, wherein the switch controller comprises:
   a first switch controller that is configured to close the first switch unit in response to activation of one of the first rows; and
   a second switch controller that is configured to close the second switch unit in response to activation of one of the second rows.

7. The semiconductor memory device of claim 6, wherein the first rows comprise a plurality of first wordlines, wherein the first switch controller comprises a plurality of first transistors, and wherein each of the first wordlines is coupled to a gate of a respective one of the first transistors, and a source/drain region of each of the first transistors is connected to an input of the first switch unit.

8. A semiconductor memory device comprising:
   a first memory cell array that comprises a plurality of first memory cells that are arranged in a matrix of first rows and first columns;
   a second memory cell array that comprises a plurality of second memory cells that are arranged in a matrix of second rows and second columns;
   a row decoder that is configured to select and activate one of the first rows or the second rows in response to a row address;
   a sense amplifier;
   a switch that is configured to selectively connect the sense amplifier to one of the first memory cell array or the second memory cell array;
   a switch controller that is configured to connect the sense amplifier to the first memory cell array if the row address corresponds to one of the first rows and to connect the sense amplifier to the second memory cell array if the row address corresponds to one of the second rows; and
   a third memory cell array that comprises a plurality of third memory cells that are arranged in a matrix of third rows and third columns,
   wherein the switch is configured to selectively connect the sense amplifier to one of the first memory cell array, the second memory cell array or the third memory cell array and
   wherein the sense amplifier is disposed between the first memory cell array and the second memory cell array.

9. A semiconductor memory device comprising:
   a first memory cell array that comprises a plurality of first wordlines, a plurality of first bitlines, and a plurality of first memory cells that are arranged at the respective intersections of the first wordlines and the first bitlines;
   a second memory cell array that comprises a plurality of second wordlines, a plurality of second bitlines, and a plurality of second memory cells that are arranged at the respective intersections of the second wordlines and the second bitlines;
   a row decoder that is configured to select one of the first and second memory cell arrays in response to a row address;
   a sense amplifier;
   a switch that is configured to connect the sense amplifier to the first memory cell array in response to a first switch enable signal and to connect the sense amplifier to the second memory cell array in response to a second switch enable signal; and
   a controller that is configured to activate one of the first and second switch enable signals in response to the row address to connect the sense amplifier to the first memory cell array when the first wordlines are selected by the row decoder or to the second memory cell array when the second wordlines are selected by the row decoder.

10. The semiconductor memory device of claim 9, wherein the sense amplifier is arranged between the first memory cell array and the second memory cell array.

11. The semiconductor memory device of claim 9, further comprising a sense amplifier controller that is configured to generate a sense amplifier enable signal in response to the switch enable signals.

12. The semiconductor memory device of claim 11, wherein each of the first and second memory cell arrays includes SRAM cells.

13. The semiconductor memory device of claim 11, wherein the switch comprises:
   a first switch unit that is coupled between the first memory cell array and the sense amplifier; and
   a second switch unit that is coupled between the second memory cell array and the sense amplifier.

* * * * *